United States Patent
Takahashi

(10) Patent No.: US 7,975,364 B2
(45) Date of Patent: Jul. 12, 2011

(54) METHOD FOR PRODUCING A TUNING-FORK TYPE CRYSTAL VIBRATING PIECE

(75) Inventor: Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 577 days.

(21) Appl. No.: 11/868,323

(22) Filed: Oct. 5, 2007

(65) Prior Publication Data
US 2008/0174208 A1 Jul. 24, 2008

(30) Foreign Application Priority Data
Oct. 6, 2006 (JP) .................................. 2006-275192

(51) Int. Cl.
*H04R 31/00* (2006.01)

(52) U.S. Cl. ............. 29/594; 29/595; 29/609.1; 216/13; 216/80; 216/97; 310/319; 310/361; 310/370; 331/158; 331/176; 430/319

(58) Field of Classification Search .................. 29/25.35, 29/594, 595, 609.1, 831, 834, 835; 216/13, 216/80, 97; 310/319, 361, 370; 331/158, 331/176; 427/100; 430/319
See application file for complete search history.

(56) References Cited

U.S. PATENT DOCUMENTS

| 6,897,737 B2 * | 5/2005 | Sakata et al. .................. 331/156 |
| 7,075,218 B2 * | 7/2006 | Matsudo et al. .............. 310/370 |

FOREIGN PATENT DOCUMENTS

| JP | 59/128815 | 7/1984 |
| JP | 01/236808 | 9/1989 |
| JP | 06-204776 | 7/1994 |
| JP | 2000/323950 | 11/2000 |
| JP | 2002-271167 | 9/2002 |
| JP | 2003/318698 | 11/2003 |
| JP | 2005-134364 | 5/2005 |
| JP | 2005-260712 | 9/2005 |
| JP | 2006/078467 | 3/2006 |
| JP | 2006/246449 | 9/2006 |

* cited by examiner

*Primary Examiner* — Paul D Kim
(74) *Attorney, Agent, or Firm* — Woodcock Washburn LLP

(57) ABSTRACT

A method for producing a tuning-fork type crystal vibrating piece relates to a crystal tuning fork comprising a basal portion, a first vibrating arm, and a second vibrating arm, wherein both arms extend from the basal portion. The method for producing a crystal tuning fork comprises a step of forming a first metallic film into a shape including the contours of the basal portion, the first vibrating arm and second vibrating arm on a first surface of a quartz wafer; a step of forming a second metallic film on the second surface opposite to the first surface of the quartz wafer into a shape covering at least a root area near the basal portion between the first vibrating arm and the second vibrating arm, and a step of wet-etching the quartz substrate in etching solution after forming the first and second metallic films.

5 Claims, 10 Drawing Sheets (b) B-B Cross section (a)

METHOD FOR PRODUCING A TUNING-FORK TYPE CRYSTAL VIBRATING PIECE

CROSS-REFERENCE TO RELATED PATENT APPLICATION

This application claims the benefit of Japanese Patent Application No. 2006-275192 filed on Oct. 6, 2006 in the Japan Patent Office, the disclosure of which is incorporated herein in its entirety by reference.

FIELD OF THE INVENTION

The present disclosure relates to a method for producing a tuning-fork type crystal vibrating piece (hereinafter denoted as "crystal tuning fork") comprising etching from a single crystal quartz wafer (hereinafter denoted as "quartz wafer"), and a method for producing a crystal oscillation device, a crystal tuning fork and a crystal oscillation device.

BACKGROUND

With the recent downsizing of communication devices and electronic devices, piezoelectric oscillation devices, such as crystal resonators for angular velocity sensors, are also required to be smaller. Tuning-fork type crystal vibrators comprising a pair of vibrating arms are used for crystal oscillation devices for high precision clocks and gyroscopes. The crystal tuning forks used for those crystal oscillation devices are produced from quartz wafers by a process including photo resist coating, photolithography and wet-etching. Several hundred to several thousand contours of crystal tuning forks are formed on a quartz wafer. Subsequently, an electrode pattern is formed on each of the several hundred to several thousand of crystal tuning forks by a process including photo resist coating, photolithography and wet-etching, using a method such as that disclosed in Japanese Unexamined Patent Publication No. 2005-134364.

FIG. 10 depicts an enlarged view of the basal portion 29 of a crystal tuning fork 20. FIG. 10a illustrates a cross-sectional view of a pair of vibrating arms 21 and the basal portion 29 across the YZ plane, while FIG. 10b illustrates a cross-sectional view of a pair of vibrating arms 21 and the basal portion 29 across the XY plane. In recent years, the width of each vibrating arm of the crystal tuning fork 20 is typically about 0.1 to 0.2 mm, and the gap between the arms 21 is also typically about 0.1 to 0.2 mm.

Quartz wafers are cut out from Y-bar or Z-plate synthetic quartz crystals with predetermined crystal orientations. The etching rate of a quartz wafer, from which the crystal tuning forks 20 are etched out, depends on the crystal orientation, the wafer having a direction in which the etch rate is higher, or lower, than other directions. As a result, bumps and grooves as shown in FIGS. 10(a) and (b) are formed in the area between the roots (hereinafter denoted as "root area") 261 of the pair of vibrating arms 21, when the quartz wafer is wet-etched from both the surfaces. With such bumps and grooves, the photoresist, coated to form an electrode pattern on the crystal tuning fork 20, tends to accumulate in the root area 261 of the vibrating arms 21. The bumps may also cause insufficient exposure at the time of the photolithography (exposure) of the electrode pattern. As a result, there has been a problem that many electrodes are short-circuited in the root area 261 of the pair of vibrating arms 21 when forming electrode patterns on crystal tuning forks. This hinders productivity and quality of the crystal tuning forks.

SUMMARY OF THE INVENTION

In a first aspect, the present disclosure relates to a method for producing a crystal tuning fork having a basal portion, a first vibrating arm and a second vibrating arm, in which both the arms extend from the basal portion. The method for producing a crystal tuning fork comprises steps of forming a first metallic film on a first surface of a quartz substrate into a shape including the contours of a basal portion, a first vibrating arm and a second vibrating arm; and forming a second metallic film on the second surface opposite to the first surface of the quartz substrate into a shape covering at least a part of the basal portion between the first vibrating arm and the second vibrating arm.

In the above configuration, the first metallic film is formed into the shape including the contours of the basal portion, the first vibrating arm and the second vibrating arm on the first surface of a quartz substrate; and the second metallic film is formed into the shape, covering at least a part of the basal portion between the first vibrating arm and the second vibrating arm on the second surface of the quartz substrate. When wet-etched, the part of the basal portion between the first and second vibrating arms, covered by the second metallic film, is not etched, because the metallic films functions as a corrosion resistant layer. As a result, the etching proceeds in only one direction, forming neither a bump nor a groove in the root area of the first and second vibrating arms. Therefore, the electrode pattern, subsequently formed, is prevented from being short-circuited and the quality of the crystal tuning fork is improved.

In the method for producing a crystal tuning fork in a second aspect, the second metallic film may cover the entire area between the first and second vibrating arms.

In the above configuration, the intervening area between the first and second vibrating arms is etched from only one direction. As a result, neither a bump nor a groove is formed in the root area of the first and second vibrating arms.

In the method for producing a crystal tuning fork in a third aspect, each of the steps of processing the first and second metallic films may comprise: a step of covering the quartz substrate with a metallic film; a step of coating the metallic film with photoresist; and a step of exposing the photoresist to form the contours on the first and second metallic films using an exposure apparatus.

In the above configuration, the first and second metallic films are processed on the quartz substrate by a "photolithography process." The process ensures the dimensional precision of the contours formed out from the first and second metallic films on both the surfaces of the quartz substrate, even in the case that the size of the crystal tuning fork is small; e.g., about 1.7 mm long and 0.5 mm wide.

The method for producing a crystal tuning fork in a fourth aspect may further comprise a step of immersing the quartz substrate in etching solution to etch the quartz substrate after the first and second metallic films are formed.

In the above configuration, a crystal tuning fork is formed from the quartz substrate by immersing the quartz substrate in etching solution.

The crystal tuning fork in a fifth aspect is produced by a method for producing a crystal tuning fork according to any one of the first to fourth aspects.

In the above configuration, several hundred to several thousand crystal tuning forks are produced from a quartz substrate with neither a bump nor a groove, the defects which tend to be formed in the root area of a pair of vibrating arms in the prior art. The absence of a step and groove on a crystal tuning fork prevents the electrode pattern, which is formed on the crystal tuning fork, from being short-circuited and the quality of the crystal tuning fork is improved.

A method for producing a crystal oscillation device in a sixth aspect comprises fastening the crystal tuning fork according to the fifth aspect in a package and sealing the package containing the crystal tuning fork.

In the above configuration a crystal oscillation device is produced using a crystal tuning fork with high quality.

According to the present disclosure, a tuning fork is formed with neither a bump nor a groove in the root area between the first and second vibrating arms. As a result, the electrode pattern formed in the backend process is effectively prevented from being short-circuited.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The foregoing summary, as well as the following detailed description of preferred embodiments, is better understood when read in conjunction with the appended drawings. For the purposes of illustration, there is shown in the drawings exemplary embodiments; however, the present disclosure is not limited to the specific methods and instrumentalities disclosed. In the drawings.

DETAILED DESCRIPTION

Figure 1:
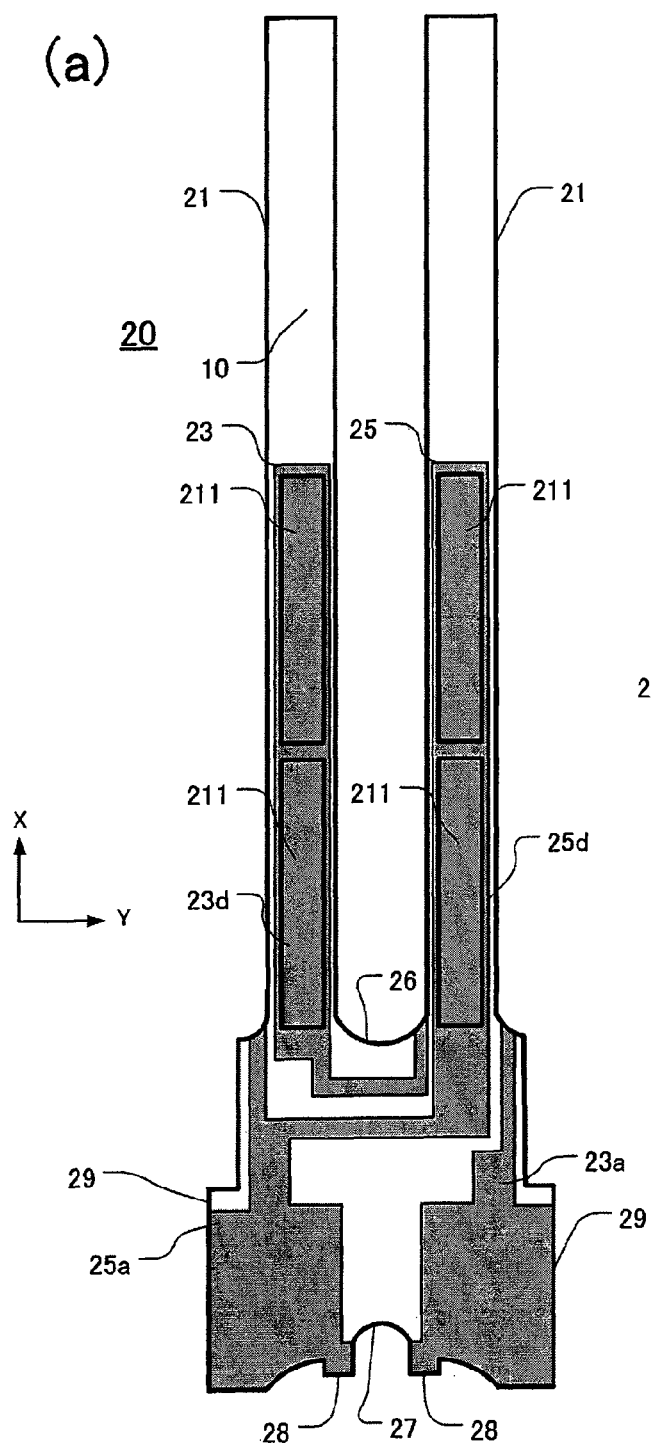
FIGS. 1(a) and 1(b) are is a diagram showing the entire structure of a crystal tuning fork 20.
Figure 1:
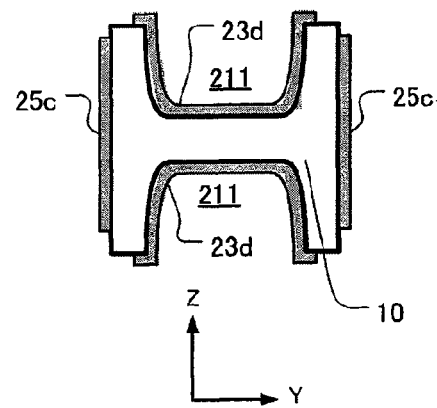

It is to be understood that the embodiments disclosed herein are not limited in application to the details of construction and the arrangement of components set forth in the following description or illustrated in the drawings. The disclosure is capable of other embodiments and of being practiced or being carried out in various ways. Also, it is to be understood that the phraseology and terminology used herein is for the purpose of description and should not be regarded as limiting.

FIG. 1 (a) depicts a plain view showing the entire structure of a crystal tuning fork 20, and (b) is a cross-sectional view of a vibrating arm 21 of the crystal tuning fork 20 across the B-B plane. The parent material of the crystal tuning fork 20 is a quartz wafer 10. As shown in FIG. 1 (a), the crystal tuning fork 20 comprises a basal portion 29 and a pair of vibrating arms 21 which fork at the basal portion 29 and extend in parallel, upward in FIG. 1, all of which are adjusted to achieve the required performance in a small size. The root area 26 of a pair of vibrating arms 21 is tapered so that the change and variation of the resonant frequency, which results from the change in ambient temperature, are minimized. The shape of the taper in the root area may be either U-shaped, V-shaped, or such. Hereinafter, preferred embodiments are explained based on a crystal tuning fork 20 comprising a pair of vibrating arms 21; however, a crystal tuning fork 20 may comprise three or four vibrating arms 21.

A crystal tuning fork 20 is a small vibrating piece which generates a signal at the frequency of 32.768 KHz, for example, and may be about 1.7 mm long and about 0.5 mm wide. Recessed areas 211 are formed on both the front and back sides of the vibrating arm 21 of the crystal tuning fork 20. There are two recessed areas 211 formed on the front side of the vibrating arm 21 and two recessed areas 211 formed on the front side of the vibrating arm 21. In other words, there are eight recessed areas 211 formed in a pair of vibrating arms 21. The depth of each recessed area 211 is about 35 to 45% of the thickness of the quartz wafer 10. Because the recessed areas are formed on both the front and back sides, the cross-section of each recessed area 211 is approximately H-shaped. The recessed areas 211 are provided to inhibit the crystal impedance (CI) value from increasing.

The entire basal portion 29 of the crystal tuning fork 20 has a plate-like shape. The length of the basal portion 29 may be about 36% of that of the vibrating arm 21. The basal portion 29 of the crystal tuning fork 20 is provided with two joint tabs 28. The joint tabs 28 keep the crystal tuning fork 20, as shown in FIG. 1, connected to the quartz wafer 10 at the time when the tuning fork is formed from the quartz wafer 10 by photolithography and wet-etching.

A first electrode pattern 23 and a second electrode pattern 25 are formed on the vibrating arm 21 and basal portion 29 of the crystal tuning fork 20. Each of the first electrode pattern 23 and a second electrode pattern 25 comprises a first chromium (Cr) underlayer of 150 to 5000 angstroms thick and a second gold (Au) layer of 100 to 5000 angstroms thick thereon. In other words, the thickness of each electrode pattern, or the combined thickness of the first and second layers, is in the range of 250 angstroms to 10000 angstroms. Alternatively, the first underlayer may comprise tungsten (W), nickel (Ni), or tungsten-nickel instead of chromium (Cr) and the second layer may comprise silver (Ag) instead of gold (Au). The electrode may consist of only one layer selected from aluminum (Al), copper (Cu) and silicon (Si).

Referring to FIG. 1(a), a first basal portion electrode 23a and a second basal portion electrode 25a are formed on the basal portion 29 of the crystal tuning fork 20, and a first recessed area electrode 23d and a second recessed area electrode 25d are formed respectively in and around the recessed area 211 of the vibrating arm 21. Referring to FIG. 1(b), a second side-surface electrode 25c is formed on each side-surface of the left vibrating arm 21 of FIG. 1(a). A first side-surface electrode 23c is formed on each side-surface of the right vibrating arm 21 which is not shown.

Manufacturing Process of a Crystal Oscillation Device

Figure 2:
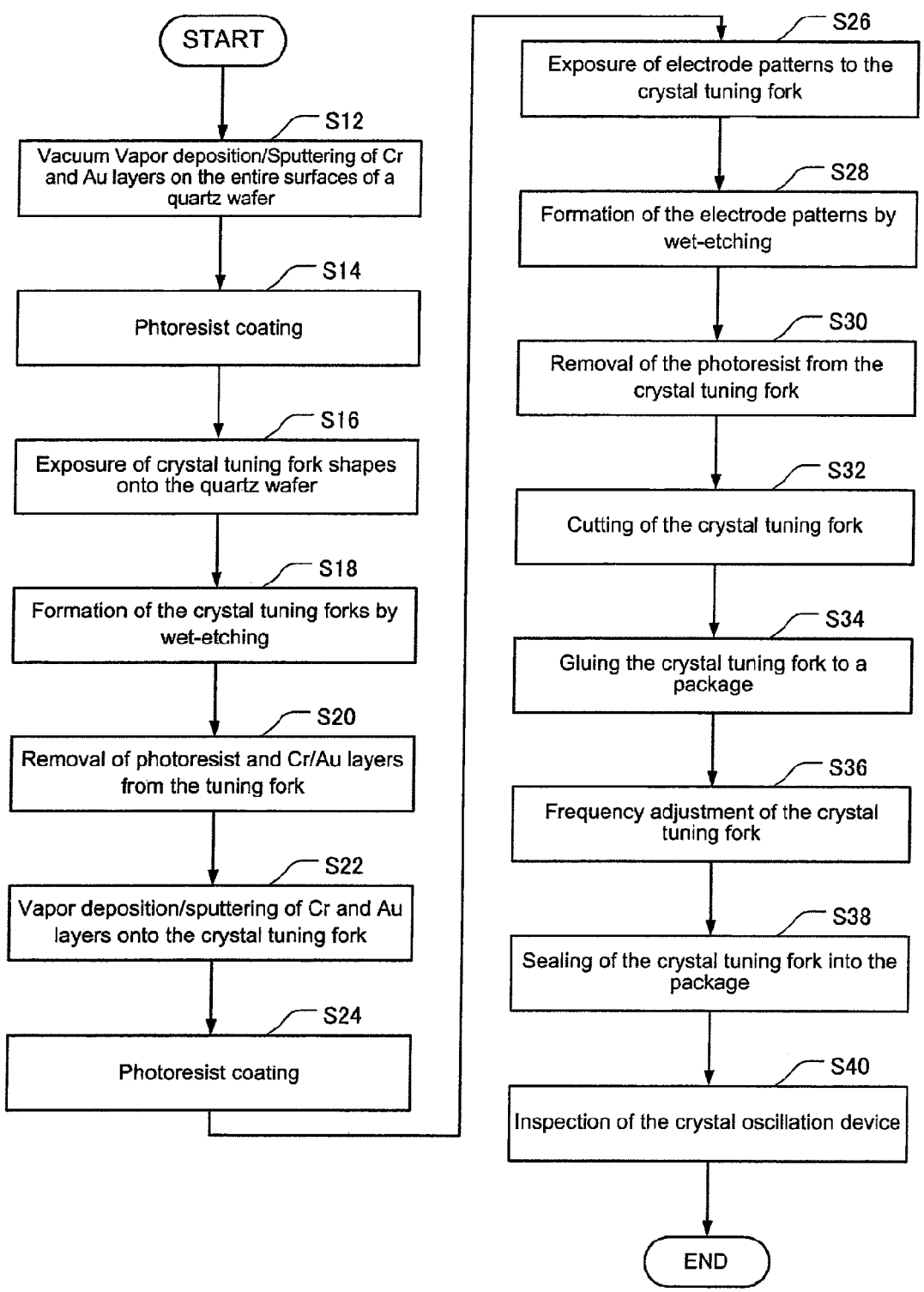
FIG. 2 is the flow chart showing the whole manufacturing process of a crystal oscillation device 50 according to the present embodiment.

FIG. 2 illustrates a flow chart showing the manufacturing process of a crystal oscillation device according to the present embodiment.

The Steps for Forming a Crystal Vibrating-Piece Contour

In step S12, a corrosion resistant film is formed on the entire surface of the quartz wafer 10 either by sputtering or by vapor deposition. An underlayer of chromium (Cr) is formed because it is difficult to deposit gold (Au) directly on the surface of the quartz wafer 10, which is used as a piezoelectric material. The thickness of the chromium layer is about 500 angstroms and the thickness of gold layer is about 500 angstroms, for example.

In step S14, a photoresist layer is coated uniformly on the entire surface of the quartz wafer, on which the chromium and gold layers have been formed, by a method such as spin-coating. Positive photoresist comprising novolac resin may be used for the photoresist layer.

Figure 6:
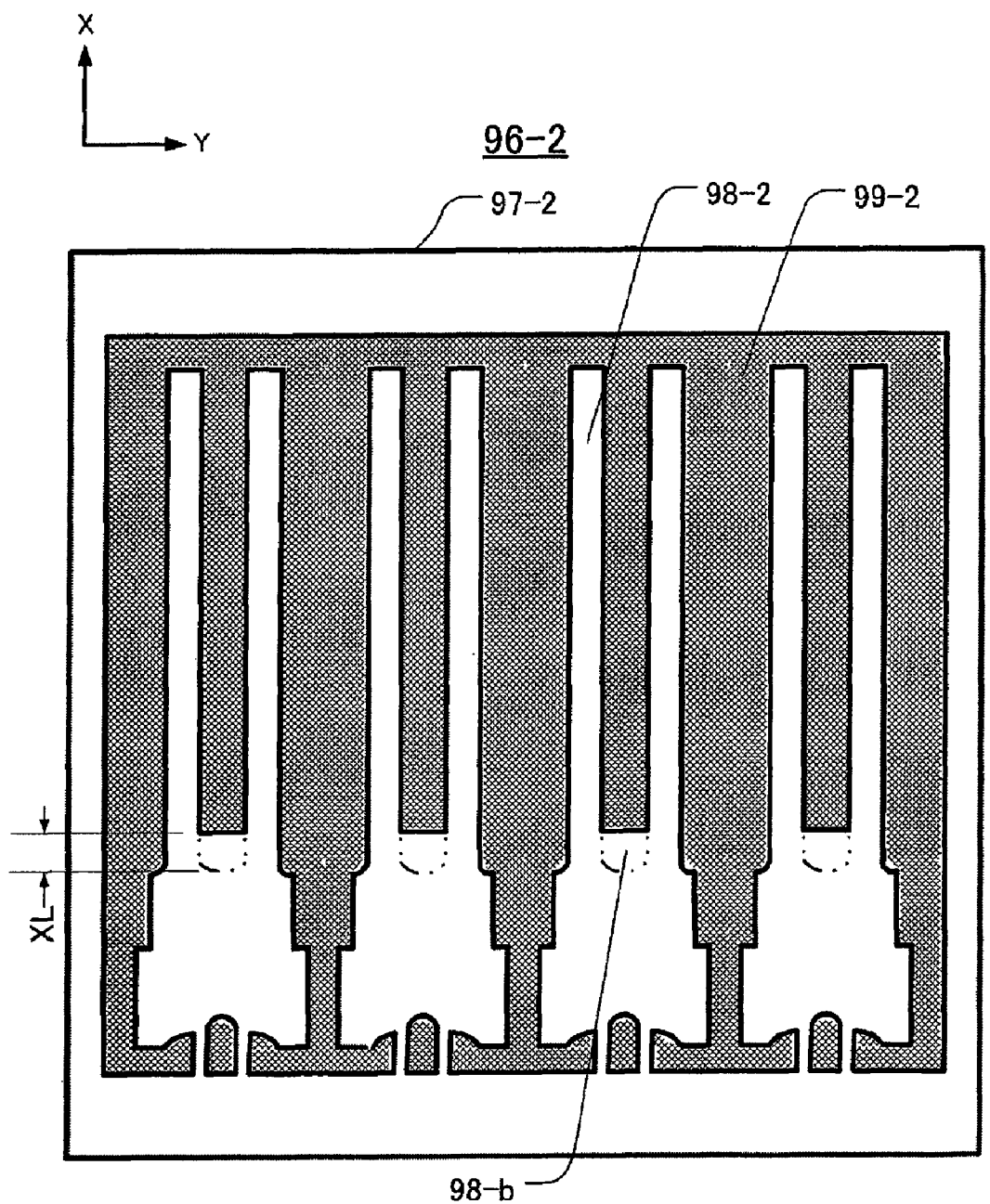
FIG. 6 is a diagram illustrating a part of another exemplary second exposure mask 96 for the back surface of the quartz wafer 10.
Figure 7:
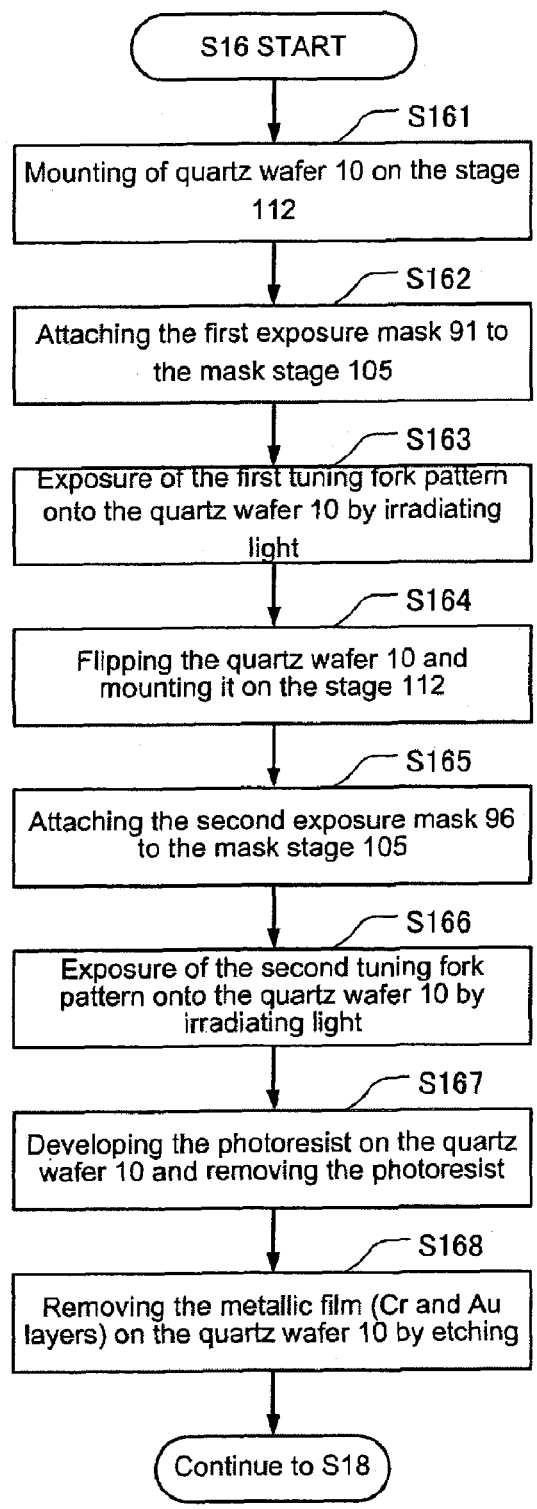
FIG. 7 is a flowchart showing processing procedure of a proximity exposure apparatus 100 to expose the first exposure mask 91 and the second exposure mask 96 onto the quartz wafer 10.

In step S16, the contours of the crystal tuning forks 20, drawn on a first exposure mask 91 or on a second exposure mask 96 (refer to FIG. 4 to FIG. 6), are projected on the quartz wafer 10 with a photoresist layer, using an exposure apparatus 100. The exposure apparatus 100 will be explained with reference to FIG. 3. FIG. 7 explained the step S16 in more detail.

In step 18, the photoresist layer on the quartz wafer 10 is developed and the exposed portion of the photoresist layer is removed. The gold film exposed from the photoresist layer is etched, for example, by a solution containing iodine and potassium iodide. Then the chromium layer exposed after the removal of the gold film is etched, for example, by a solution containing diammonium cerium nitrate and acetic acid. The concentration and temperature of each solution, along with the immersion time, are adjusted so that the masked portions are not eroded. The corrosion resistant film consisting of a photoresist layer and metallic films is thus removed. Next, the quartz material exposed after the removal of the photoresist layer and metallic films is wet-etched by a solution containing hydrofluoric acid into the shape of the crystal tuning fork 20. The wet-etching proceeds simultaneously from the front and back sides of the quartz wafer 10, and the process takes about 6 to about 15 hours, depending on the concentration, type, temperature and such of the etching solution containing hydrofluoric acid.

In step S20, the photoresist layer and metallic film that have become unnecessary are removed to form the crystal tuning fork 20 shown in FIG. 1.

The Steps for Forming Electrodes

In step S22, the crystal tuning fork 20 is rinsed with pure water. A metallic film to form an electrode, such as driving and excitation electrodes is deposited on the entire surface of the crystal tuning fork 20 by a method, such as vapor deposition and sputtering. The metallic film comprises a chromium underlayer and a gold film. Incidentally, the corrosion resistant film and the metallic film may comprise the same material and, in the case that the corrosion resistant film is used as an electrode, the corrosion resistant film does not have to be removed in step S20, and a new metallic film does not have to be formed in step S22.

In step S24, photoresist is sprayed on the entire surface.

In step 26, a third exposure mask, corresponding to the first electrode pattern 23 and the second electrode pattern 25, is used to expose the first electrode pattern 23 and the second electrode pattern 25 on the quartz wafer 10 having a photoresist layer. In this step, i-ray at 365 nanometer wavelength is used to expose both the surfaces of the crystal tuning fork 20 to form the first electrode pattern 23 and the second electrode pattern 25 on both the surfaces.

In step S28, the photoresist layer is developed and the exposed portion of the photoresist is removed. The remaining photoresist has the patterns corresponding to the first electrode pattern 23 and the second electrode pattern 25. Next, in step S28, the metallic film is etched to form the electrodes. More specifically, the gold film exposed from the photoresist layer, having the pattern corresponding to the electrodes, is etched, for example, by a solution containing iodine and potassium iodide, and the chromium underlayer is etched, for example, by a solution containing diammonium cerium nitrate and acetic acid.

Subsequently, in step 30, the photoresist layer is removed. Through the above steps, the first electrode pattern 23 and the second electrode pattern 25 having precise widths are formed at precise positions on the crystal tuning fork 20.

In step 32, the crystal tuning fork 20 is cut off from the quartz wafer 10. If required, the joint tabs 28 are checked if they are not extending out of the basal portion 29. If a joint tab 28 is extending out of the basal portion 29, the tuning fork is rejected, or the joint tab 28 is shortened so that the joint tab 28 stays inside the end of the tuning fork.

The Steps for Frequency Adjustment and Packaging

A crystal tuning fork 20 is obtained from the above process.

In step 34, the crystal tuning fork 20 is glued to a ceramic package 51 with conductive adhesive 57. More specifically, the basal portion 29 of the crystal tuning fork 20 is placed on the conductive adhesive 57 applied on an electrode portion 52 (refer to FIG. 9), and the conductive adhesive 57 is pre-cured. Subsequently, the conductive adhesive 57 is cured in a curing furnace to fasten the crystal tuning fork to the package 51.

In step S36, a laser beam is irradiated to the vibrating arm 21 of the crystal tuning fork 20 to evaporate, or to sublimate, a portion of the quartz wafer 10 of the vibrating arm 21, so that its frequency is adjusted by weight reduction. The crystal tuning fork 20 in steps S16, S18 and others has vibrating arms 21 that are slightly oversized. The patterns of the exposure masks may be made in such a way that the resulting vibrating arms 21 become slightly oversized, and the wet etching may be controlled so that the quartz wafer 10 is not etched excessively.

In step 38, the package 51 containing the crystal tuning fork 20 is transferred into a vacuum chamber and such to seal the lid 59 by sealant 58. Finally, in step S38, the crystal oscillation device 50 is inspected for its operating characteristics to complete the crystal oscillation device 50.

The Configuration of a Proximity Exposure Apparatus 100

Figure 3:
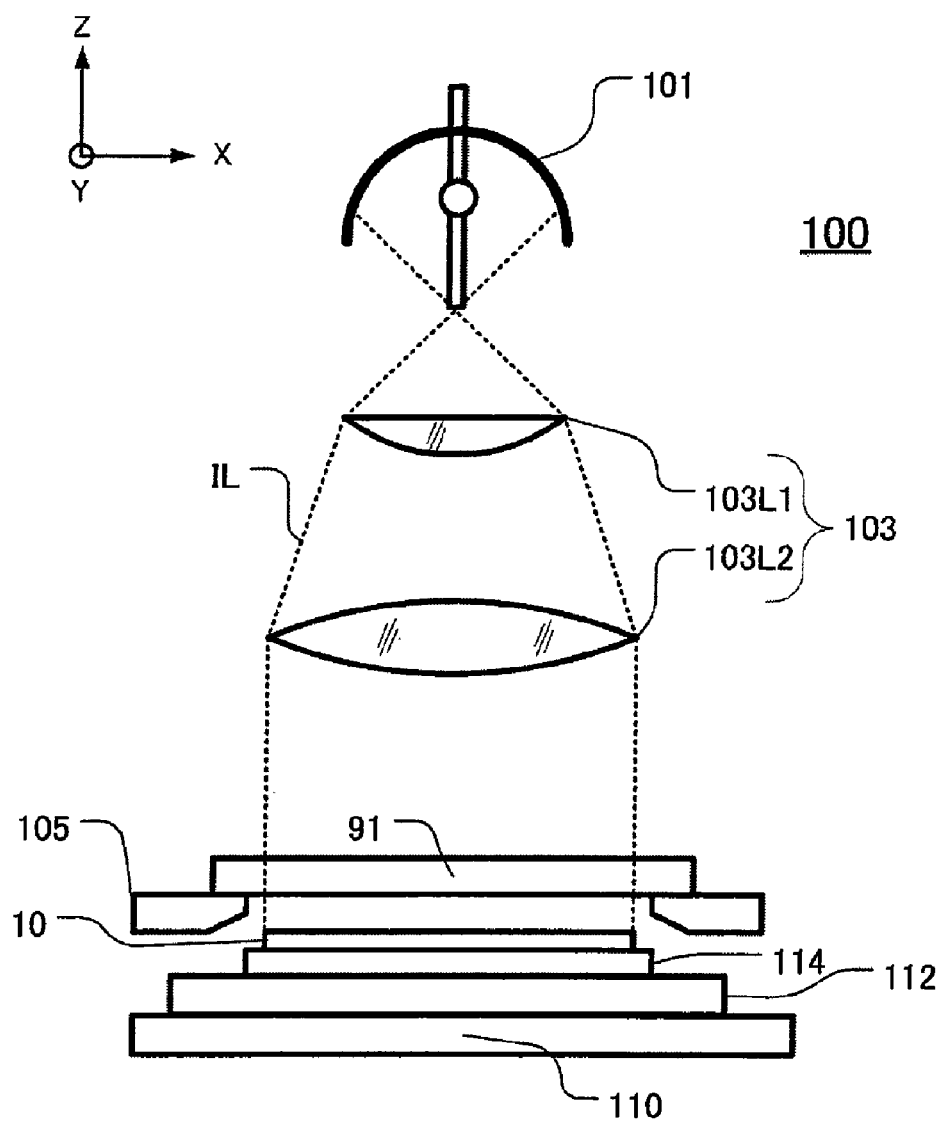
FIG. 3 is a side view of a proximity exposure apparatus 100, having an exemplary configuration, which is used to expose a predetermined pattern onto a quartz wafer 10.

FIG. 3 illustrates a side view of an exemplary proximity exposure apparatus 100, which is used to project a predetermined pattern formed on a first exposure mask 91 (refer to FIG. 4), or an original plate, onto a quartz wafer 10. The proximity exposure apparatus 100 includes an exposure optical system 103, comprising an exposure light source 101 which irradiates exposure light IL having short wavelength, e.g. 300 nm, and condenser lenses 103L1 and 103L2 which bring the exposure light IL from the exposure light source 101 in parallel to an exposure mask 91.

In addition, the proximity exposure apparatus 100 comprises a mask stage 105 which holds the exposure mask 91 and moves in the X-Y plane, a vacuum chuck 114 for securing the quartz wafer 10 and a wafer stage 112 supporting the vacuum chuck 114. The wafer stage 112 is able to move in the X-axis direction and Y-axis direction of the X-Y plane on a base 110 and to be rotated around the Z-axis in accordance with users' operation. The wafer stage 112 also moves in the Z direction so that the distance between the quartz wafer 10 and exposure mask 91 is fine tuned. More specifically, the distance is adjustable from about one micron to several tens of microns. The quartz wafer 10 may be attached to, or detached from, the vacuum chuck 114 by turning on, or off, the vacuum.

The Configuration of the Exposure Masks

Figure 4:
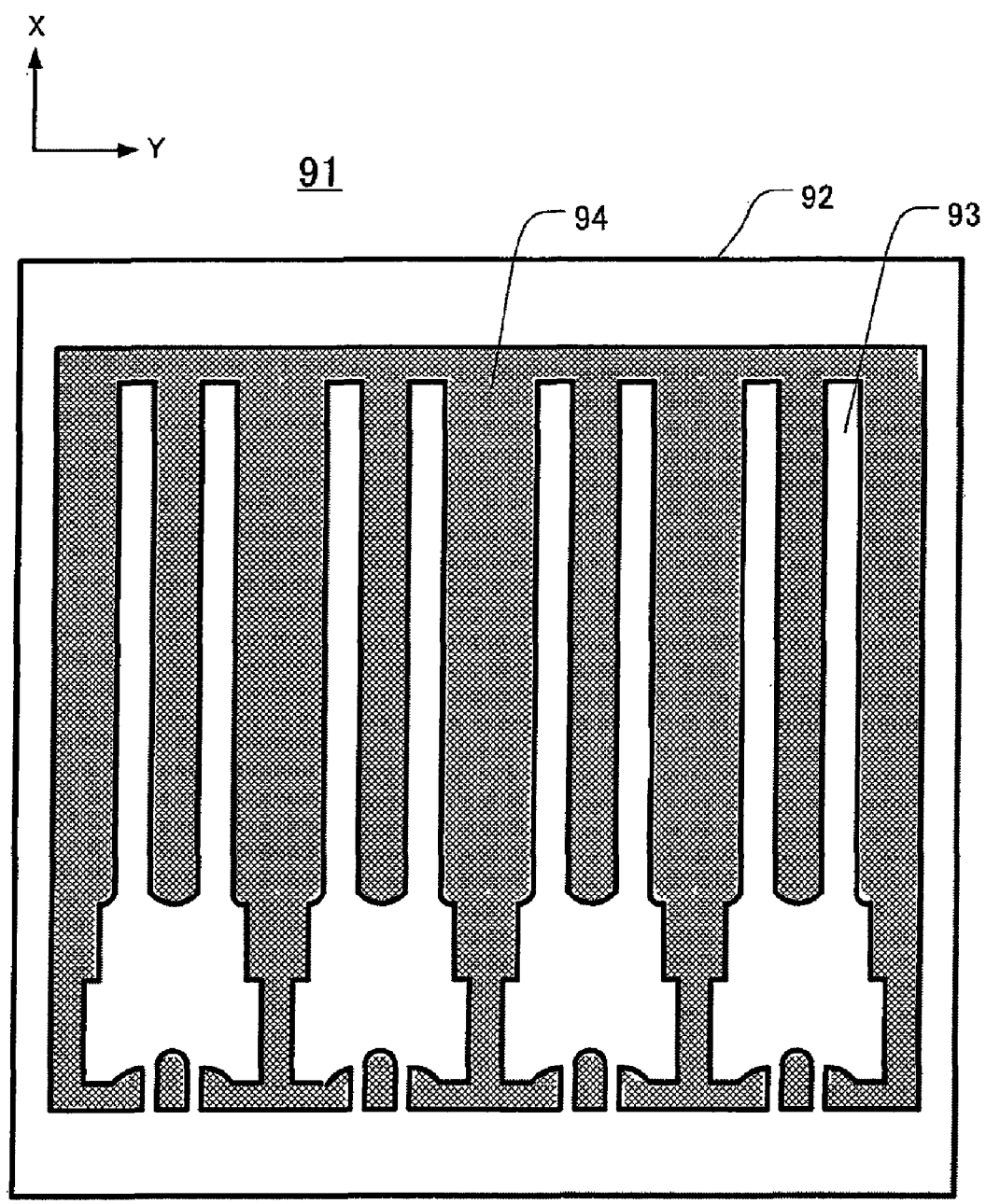
FIG. 4 is a diagram illustrating a part of a first exposure mask 91 for the front surface of the quartz wafer 10.
Figure 5:
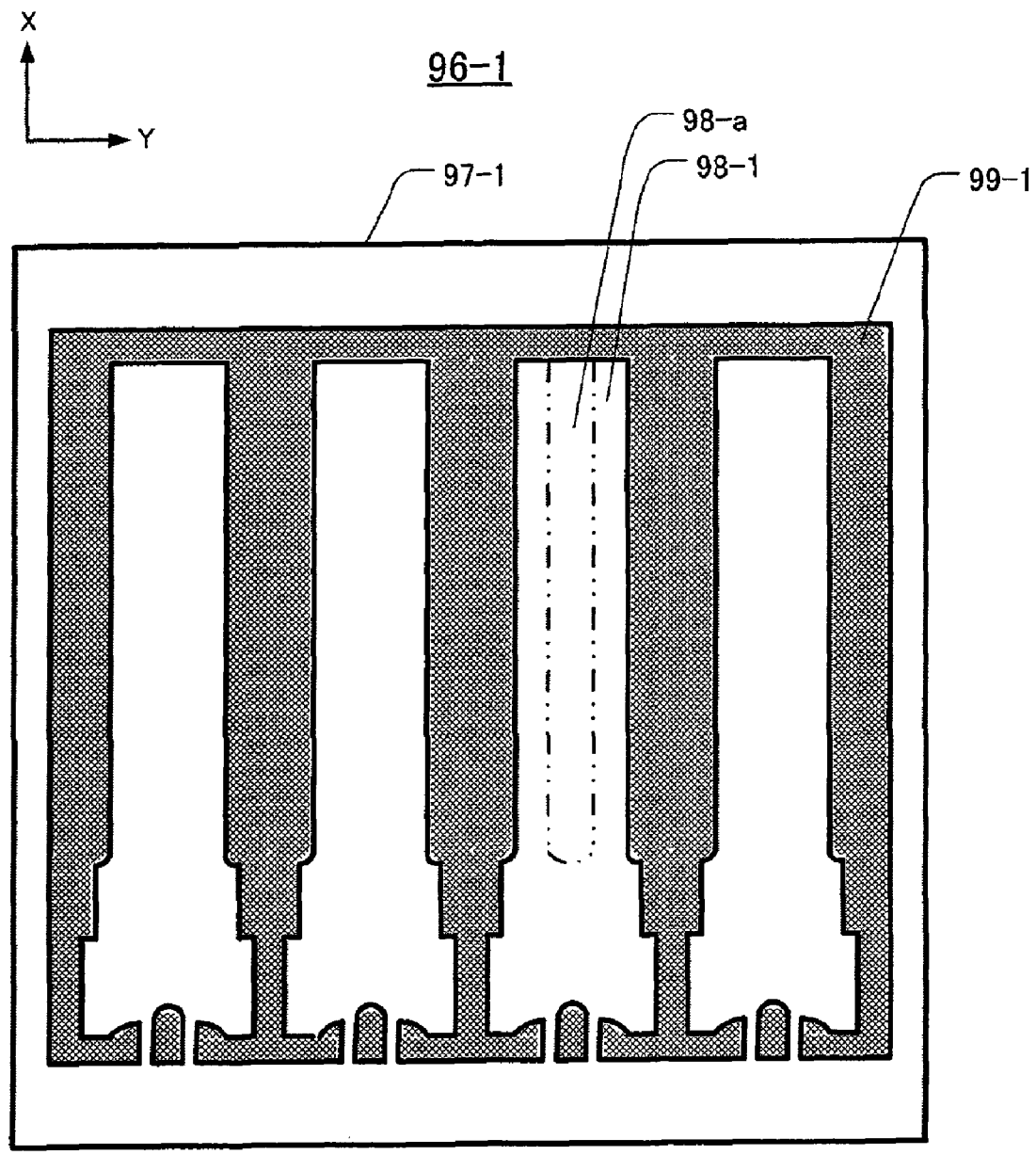
FIG. 5 is a diagram illustrating a part of an exemplary second exposure mask 96 for the back surface of the quartz wafer 10.

FIG. 4 illustrates a partial view of a first exposure mask 91 for the first (front) wafer surface. FIG. 5 illustrates a partial view of an exemplary second exposure mask 96 for the second (back) wafer surface. FIG. 6 illustrates a partial view of another exemplary second exposure mask 96-2 for the second (back) wafer surface.

The first exposure mask 91 for the front side in FIG. 4 is for use with positive photoresist and comprises a chromium layer formed on a quartz glass plate in a shape containing a mask frame 92 and a first tuning fork pattern 93. The hatched area 94 is a transmission area wherein the quartz glass remains transparent as is. Conversely, in the case that the mask is used with negative photoresist, the hatched area 94 is shielded with chromium. Hereinafter, the present embodiment is described in view of the case wherein positive photoresist is used. The first tuning fork pattern 93 is surrounded by a mask frame 92 and has a portion corresponding to a pair of vibrating arms 21 and basal portion 29 of a crystal tuning fork 20. A portion corresponding to a joint tab 28 is provided in the first tuning fork pattern 93 so that the produced tuning fork 20 will not be separated from the quartz wafer 10. In the photolithography process, the exposed portion of the photoresist on the quartz wafer is removed to expose the metallic film thereunder. The metallic film portion exposed is removed by etching. As a result, a metallic film having the contour identical to the shape of the pattern on the exposure mask 91 in FIG. 4 is formed on the front side of the quartz wafer 10.

The second exposure mask 96-1 for the back side shown in FIG. 5 comprises a mask frame 97-1 and a second tuning fork pattern 98-1, corresponding to the outer contour of the crystal tuning fork 20. In the second tuning fork pattern 98-1, the entire area 98-a intervening between the pair of vibrating arm 21 is shielded. In the photolithography process, the exposed portion of the photoresist is removed and the metallic film portion that is not covered by the photoresist is removed by etching. As a result, a metallic film having the contour identical to the shape of the pattern on the second exposure mask 96-1 in FIG. 5 is formed on the back side of the quartz wafer 10. When wet-etched, the etching proceeds only from the front side, and no etching occurs in the area 98-a on the back side, because the area 98-a on the back side on the quartz wafer 10 is shielded.

The second exposure mask 96-2 for the back side shown in FIG. 6 comprises a mask frame 97-2 and a second tuning fork pattern 98-2, corresponding to the outer contour of the crystal tuning fork 20. In the second tuning fork pattern 98-2, only an area 98-b, the area corresponding to the tuning fork portion between a pair of vibrating arms near the basal portion 29, is shielded. The area 98-b shields only a portion extending for a distance of XL from the point corresponding to the edge of the root area of the vibrating arms 21 in the basal portion 29. The distance XL is set to such a distance that wet-etching proceeds in only one direction in the root area 26 of the vibrating arms 21. In the case that the distance XL is too short, etching solution may erode the quartz wafer 10 from both the sides. In the photolithography process, the exposed portion of the photoresist is removed to expose the metallic film thereunder. The metallic film portion exposed is removed by etching. As a result, a metallic film having the contour identical to the shape of the pattern on the second exposure mask 96-2 in FIG. 6 is formed on the backside of the quartz wafer 10.

The Exposure Procedure Using a Proximity Exposure Apparatus 100

FIG. 7 is a flowchart showing processing procedure of a proximity exposure apparatus 100. The flowchart explains the step S16 of the manufacturing process of a crystal oscillation device shown in FIG. 2 in more detail. The proximity exposure apparatus 100 operates according to the following procedure.

In step S161, a quartz wafer 10 is placed on the vacuum chuck 114 with its front surface in the direction the mask stage 105. The orientation flat 10c (refer to FIG. 8) of the wafer is aligned with the X-axis direction of the wafer stage 112 before vacuum-chucking the wafer.

In step S162, the first exposure mask 91 is positioned on the mask stage 105 and fixed thereto. The quartz wafer 10 is aligned with the first exposure mask 91 using an alignment mark (not shown).

In step S163, the exposure light IL from the exposure light source 101 is irradiated on the exposure mask 91. Then, the exposure light IL is blocked by the first tuning fork pattern 93 of the crystal tuning fork 20, but transmits through the transmission area (hatched area) 94 and irradiates the photoresist layer coated on the front surface of the quartz wafer 10.

In step S164, the quartz wafer 10 is detached from the vacuum chuck 114 by releasing its vacuum. Then, the quartz wafer 10 is placed on the vacuum chuck 114 with its back surface facing in the direction of the mask stage 105 and is vacuum-chucked. At this time, the orientation flat 10c (refer to FIG. 8) of the wafer is aligned with the X-axis direction of the wafer stage 112 before vacuum-chucking the wafer.

In step S165, the exposure mask 91 is detached from the mask stage 105 and the second exposure mask 96 is positioned thereon and fixed thereto.

In step S166, the exposure light IL is irradiated on the exposure mask 96. Then, the exposure light IL is blocked by the second tuning fork pattern 98 of the turning fork 20, but transmits through the transmission area (hatched area) 99 and irradiates the photoresist layer coated on the back surface of the quartz wafer 10.

After both the front and back surfaces of the quartz wafer 10 are exposed, the surfaces of the quartz wafer 10 are developed, and the exposed photoresist layers are removed. The metallic film (containing gold and chromium layers) is exposed in the area where the photoresist layer is removed.

In step S167, the gold layer is etched, for example, by a solution containing iodine and potassium iodide. Subsequently, the chromium layer, exposed after the removal of the gold layer, is etched, for example, by a solution containing diammonium cerium nitrate and acetic acid.

Thus, the quartz wafer 10 is exposed in the irradiated area after the above process. On the other hand, a corrosion resistant film comprising the photoresist and metallic film (containing gold and chromium layers) remains in the unexposed area.

In other words, the first tuning fork pattern 93 as shown in FIG. 4 is formed by photoresist and metallic film (containing gold and chromium layers) on the front surface of the quartz wafer 10 and the second tuning fork pattern 98-1 or 98-2, as shown in FIG. 5 or FIG. 6, is formed by photoresist and metallic film (containing gold and chromium layers) on the back surface of the quartz wafer 10. The quartz wafer 10 with the tuning fork patterns is immersed in etching solution, such as hydrofluoric acid, to wet-etch the quartz portion, exposed from the photoresist layer and metallic film, from both the front and back surfaces.

Figure 10:
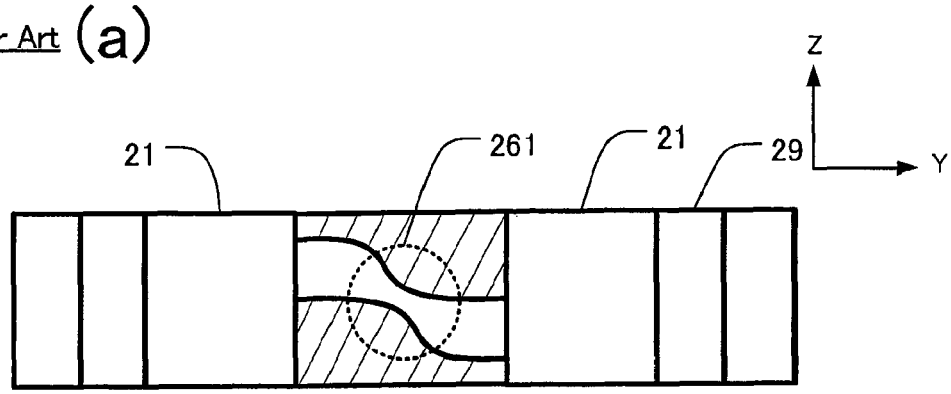
FIG. 10 is an enlarged view of the basal portion 29 of a conventional crystal tuning fork 20.
Figure 10:
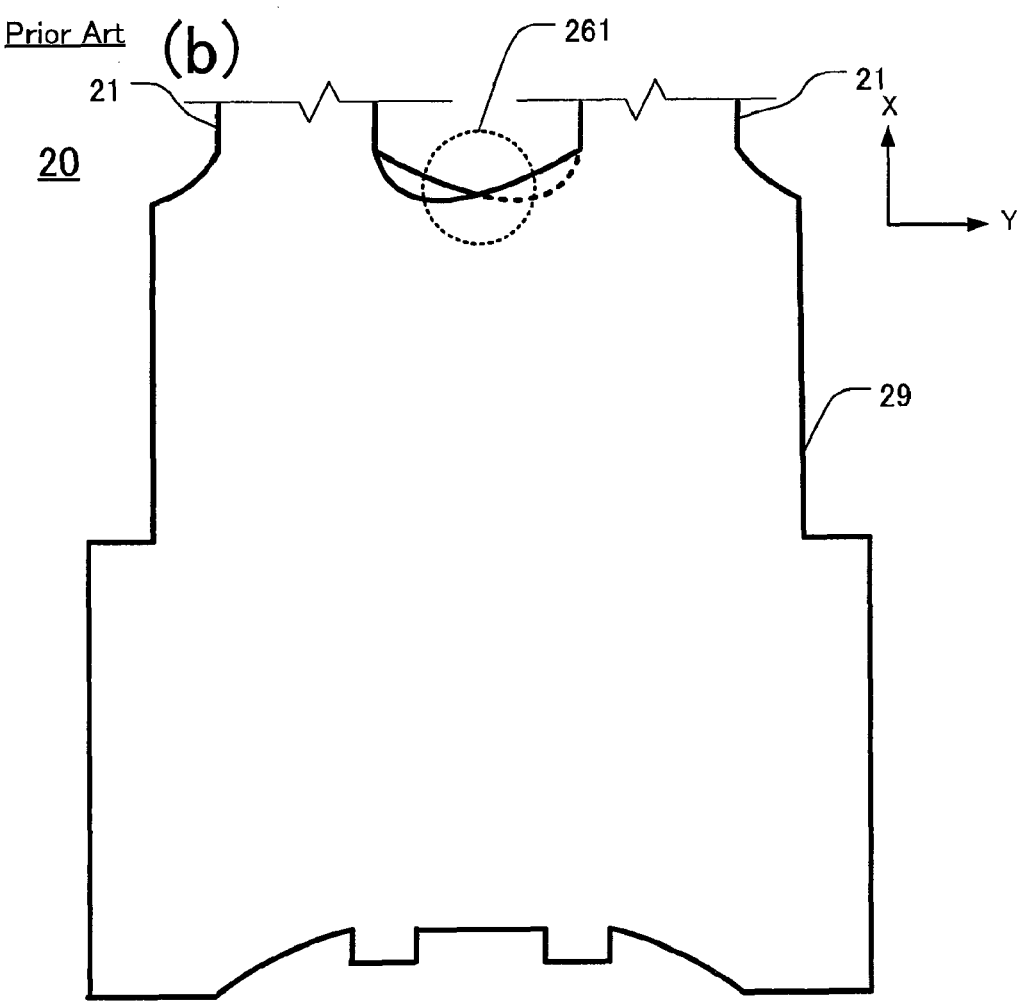

The first tuning fork pattern, as shown in FIG. 4, allows the etching to proceed in the area between a pair of the vibrating arms 21 in which the quartz wafer 10 is exposed. However, etching does not proceed in the area 98-a between the pair of vibrating arms 21, shown in FIG. 5, because the portion of the quartz wafer 10 is shielded by the corrosion resistant film. Briefly, the etching in the area between the pair of the vibrating arms 21 proceeds in only one direction from the front surface. As a result, neither a bump nor a groove is formed, unlike the case where the etching proceeds in both the directions as shown in FIG. 10.

Furthermore, etching does not proceed in the area 98-b between the pair of vibrating arms 21 near the basal portion, shown in FIG. 6, because the portion of the quartz wafer 10 is shielded by the corrosion resistant film. That means that etching proceeds in only one direction from the front surface in the root area of the pair of vibrating arms 21. As a result, neither a bump nor a groove is formed, unlike the case where the etching proceeds in both the directions as shown in FIG. 10.

The Configuration of a Single Crystal Quartz Wafer

Figure 8:
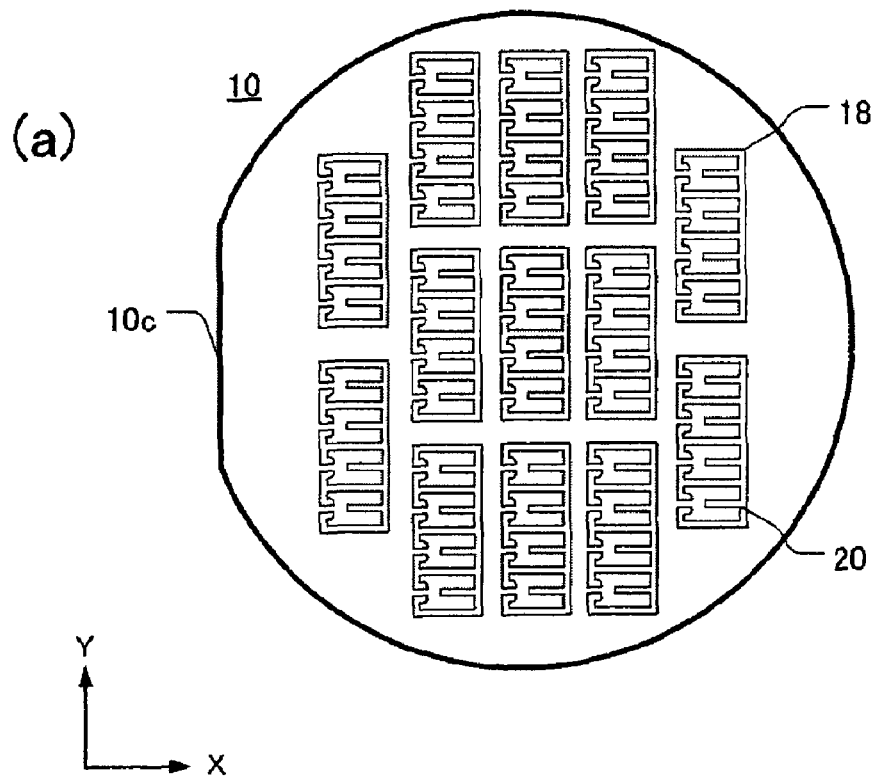
FIGS. 8(a) and 8(b) show shows plain views of a circular quartz wafer 10 and a rectangular quartz wafer 15, on which the contours of the crystal tuning forks are formed.
Figure 8:
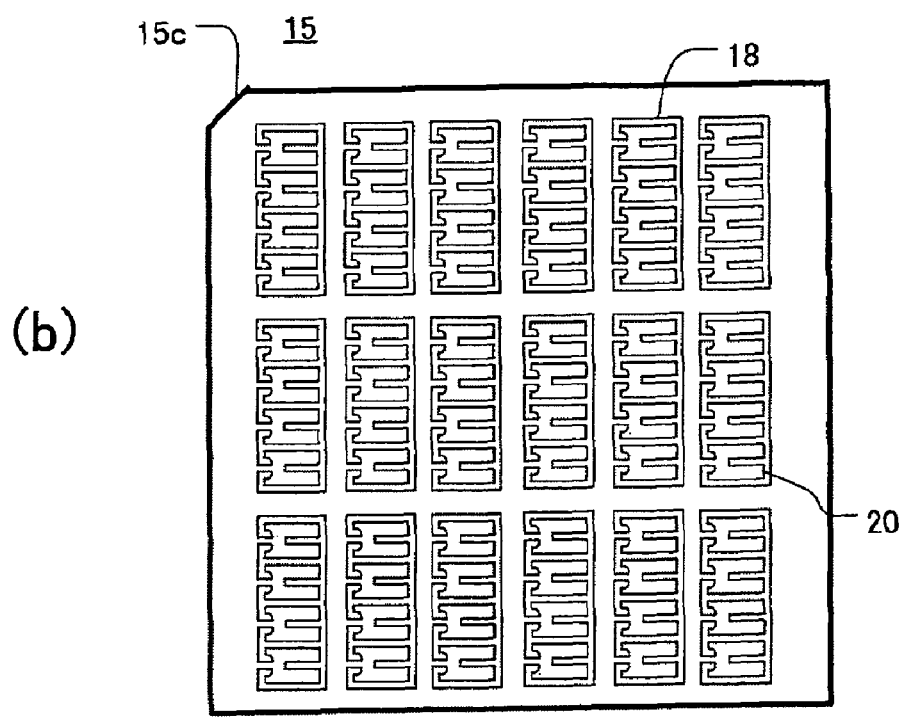

FIG. 8 is a plain view of the quartz wafer 10 on which the contours of the crystal tuning forks are formed by the wet-etching in step S18 of FIG. 2. The quartz wafer 10 is a piece of synthetic quartz of 0.4 mm thick.

FIG. 8(a) shows a circular quartz wafer 10. The circular quartz wafer 10 is made of synthetic quartz having dimensions, e.g., 0.4.mm thick and 3 inch or 4 inch in diameter. An orientation flat 10c, identifying the crystal orientation of the quartz, is formed at the periphery of quartz wafer so that the crystal axis of the circular quartz wafer 10 is identified.

FIG. 8(b) shows the configuration of a rectangular quartz wafer 15 according to an embodiment of the present disclosure. The rectangular quartz wafer 15 is also made of synthetic quartz having dimensions, e.g., 0.4.mm thick and 2 inch square. An orientation flat 15c, identifying the crystal orientation of the quartz, is formed at the periphery of the rectangular quartz wafer so that the crystal axis of the rectangular quartz wafer 15 is identified.

The circular quartz wafer 10 in FIG. 8(a) and the rectangular quartz wafer 15 in FIG. 8(b) are provided with a plurality of windows 18 for the purpose of process control and wafer strength, and a plurality of crystal tuning forks 20 are formed in each of the windows. The positions of the windows 18 and crystal tuning forks 20 are defined based on the orientation flat 11c or the orientation flat 15c in FIG. 8.

The Configuration of a Crystal Oscillation Device

Figure 9:
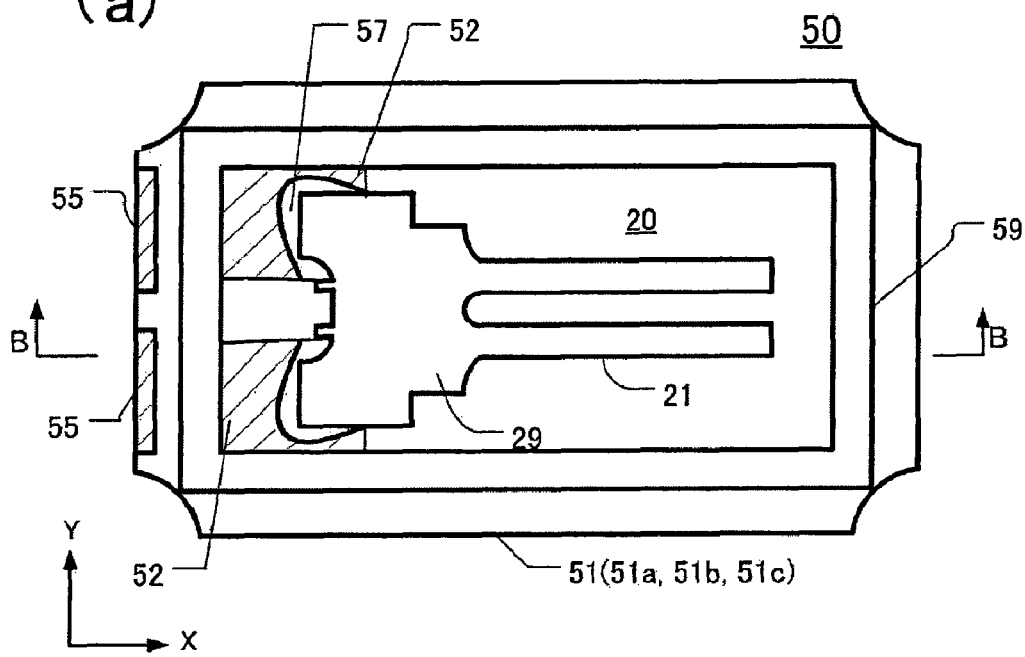
FIGS. 9(a) and 9(b) illustrate illustrates an embodiment of the crystal oscillation device 50.
Figure 9:
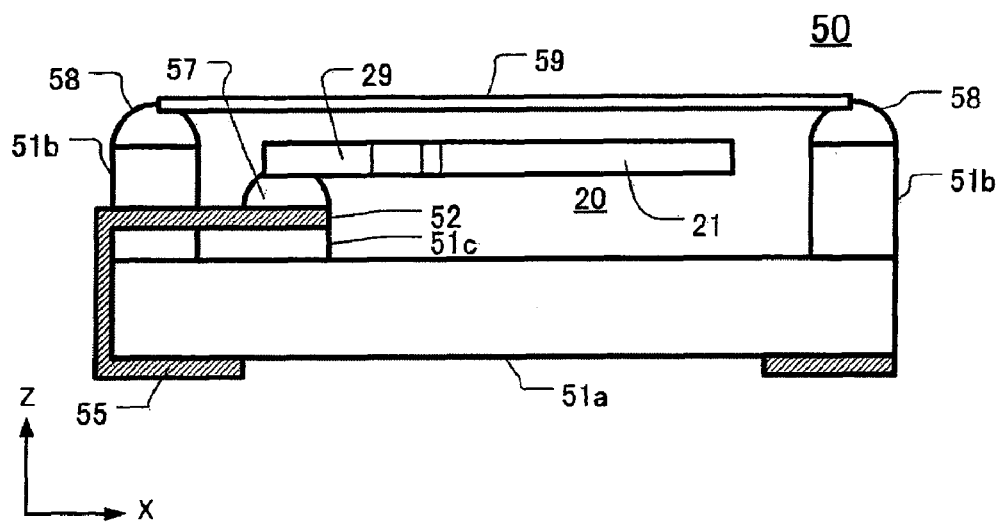

FIG. 9 illustrates an embodiment of the crystal oscillation device 50. The crystal oscillation device 50 is used widely in small information devices, such as HDDs (Hard Disk Drives), mobile computers and IC cards, and mobile communication devices, such as cellular phones, automobile phones and paging systems. FIG. 9(a) is the perspective plain view of a crystal oscillation device 50 and FIG. 9(b) is a cross-sectional view across the B-B plane in FIG. 9(a). FIG. 9 exemplifies the crystal oscillation device 50 having a crystal tuning fork 20, wherein the crystal tuning fork 20 is contained in the package 51 of the crystal oscillation device 51. The package is made, for example, through a process comprising steps of kneading a mixture containing aluminum oxide insulator; forming the mixture into a green sheet, laminating the ceramic green sheets into a pre-form and sintering the pre-form.

The package 51 in this embodiment comprises a base plate 51a, wall 51b and bottom plate 51c. The wall 51b surrounds the package 51 creating a space inside wherein a crystal tuning fork 20 is contained. The crystal tuning fork 20 is mounted on the base plate 51a so that the tuning fork is supported at a predetermined height. The bottom plate comprises an electrode portion 52 formed, for example, of gold and nickel plated on a metallized layer of tungsten.

The electrode portion 52 is connected to a mounting terminal 55 formed underneath the base plate 51a. External driving voltage is applied on the electrode portion 52 via the mounting terminal 55 and is supplied to the crystal tuning fork 20. More specifically, the mounting terminal 55 and the electrode portion 52 may be connected by a metallized layer on the package 51, as shown in FIG. 9(b), or they may be connected via a through hole (not shown) formed by metallization and such prior to sintering the base plate 51a. In the present embodiment, a box-like package 51 is used to contain the crystal tuning fork 20, however, other packaging methods may also be used. An exemplary method includes a cylindrical metal case containing a crystal tuning fork, wherein a lead connected to the crystal tuning fork is hermetically sealed by a plug connected to the outside.

The conductive adhesive 57 applied on the electrode portion 52 joins the basal portion 29 of the crystal tuning fork 20 to the electrode portion 52. The conductive adhesive 57 may contain synthetic resin, which is a glue component for providing joining force, conductive filler (including conductive particles such as silver particulate) and appropriate solvent.

The open top of the wall 51b is joined to a lid 59 by a sealant 58 and is thus sealed. Preferably, the lid 59 is made of a metal, such as Kovar, and is fixed onto the wall 51b by a method, such as seam-welding.

The exposure apparatus explained above exposes only one side of the quartz wafer 10 at a time, however, a double-sided simultaneous exposure apparatus may be used alternatively. The double-sided simultaneous exposure apparatus shortens the time required for the exposure. A reduced projection exposure apparatus with a reduced projection lens may also be used.

In the above explained embodiment, the first exposure mask 91 is projected onto the front surface of the quartz wafer 10 and the second exposure mask 96 is projected onto the back surface of the quartz wafer 10. In a converse embodiment, the first exposure mask 91 may be projected onto the back surface of the quartz wafer 10 and the second exposure mask 96 may be projected onto the front surface of the quartz wafer 10.

While the present disclosure has been described in connection with the preferred aspects, as illustrated in the various figures, it is understood that other similar aspects may be used or modifications and additions may be made to the described aspects for performing the same function of the present disclosure without deviating there from. For example, in various aspects of the disclosure, methods for producing a tuning-fork type crystal vibrating piece having neither a bump nor a groove at the root area of a pair of vibrating arms and for producing a crystal oscillation device have been disclosed. The various embodiments disclosed herein may be used in conjunction with fabrication of various kinds of devices. However, other equivalent mechanisms to these described aspects are also contemplated by the teachings herein. Therefore, the present disclosure should not be limited to any single aspect, but rather construed in breadth and scope in accordance with the appended claims.

What is claimed:

1. A method for producing a tuning-fork type crystal vibrating piece having a basal portion, a first vibrating arm and a second vibrating arm, wherein both the arms extend from the basal portion, comprising:
    a step of forming a first metallic film on a first surface of a quartz substrate into a shape including contours of the basal portion, the first vibrating arm and the second vibrating arm;
    a step of forming a second metallic film on the second surface opposite to the first surface of the quartz substrate into a shape including the contours and covering at least a root area near the basal portion in between the contours between the first vibrating arm and the second vibrating arm; and
    a step of wet-etching the quartz substrate in etching solution after forming the first and second metallic films.

2. The method for producing a tuning-fork type crystal vibrating piece of claim 1, wherein the second metallic film covers the entire area intervening between the first vibrating arm and the second vibrating arm.

3. The method for producing a tuning-fork type crystal vibrating piece of claim 2, wherein each of the steps of forming the first metallic film and the second metallic film further comprise:
- a step of covering the quartz substrate with a metallic film;
- a step of coating the metallic film with photoresist; and
- a step of exposing the photoresist to form the contours on the first and second metallic films using an exposure apparatus.

4. The method for producing a tuning-fork type crystal vibrating piece of claim 1, wherein each of the steps of forming the first metallic film and the second metallic film further comprise:
- a step of covering the quartz substrate with a metallic film;
- a step of coating the metallic film with photoresist; and
- a step of exposing the photoresist to form the contours on the first and second metallic films using an exposure apparatus.

5. The method for producing a tuning-fork type crystal vibrating piece of claim 1, further comprising a step of immersing the quartz substrate in etching solution to etch the quartz substrate after the first and second metallic films are formed.

* * * * *